United States Patent [19]

Nagano et al.

[11] 4,370,608

[45] Jan. 25, 1983

[54] INTEGRABLE CONVERSION CIRCUIT FOR CONVERTING INPUT VOLTAGE TO OUTPUT CURRENT OR VOLTAGE

[75] Inventors: Katsumi Nagano, Hiratsuka; Daijiro Kubo, Yokohama, both of Japan

[73] Assignee: Tokyo Shibaura Denki Kabushiki Kaisha, Japan

[21] Appl. No.: 252,197

[22] Filed: Apr. 8, 1981

[30] Foreign Application Priority Data

Apr. 14, 1980 [JP] Japan .................................. 55-49022

[51] Int. Cl.$^3$ .............................................. G05F 3/16
[52] U.S. Cl. .................................... 323/316; 323/314
[58] Field of Search ............... 323/312, 313, 314, 315, 323/316, 317; 363/73; 307/296 R, 297; 330/257, 288

[56] References Cited

U.S. PATENT DOCUMENTS 4,045,694  8/1977  Ahmed ............................ 323/316 X
4,103,249  7/1978  Burdick .......................... 323/315 X
4,237,414 12/1980  Stein ................................... 323/312

FOREIGN PATENT DOCUMENTS 55-138906 10/1980 Japan ................................... 330/288

OTHER PUBLICATIONS

Pookaiyandom et al., An Integral Precision Voltage-to-Current Converter with Bilateral Capability, 13 *IEEE J. of Solid State Circuits* 411-413, (Jun. 1978).

*Primary Examiner*—William M. Shoop
*Assistant Examiner*—Peter S. Wong
*Attorney, Agent, or Firm*—Finnegan, Henderson, Farabow, Garrett & Dunner

[57] ABSTRACT

An integrable conversion circuit for linearly converting an input voltage applied to the circuit with the high potential of a DC power source taken as a reference to an output current or voltage with high accuracy. The circuit includes first and second PNP transistors whose bases are connected to each other. The first transistor has its base and collector connected together. The emitter of the first transistor is connected to one end of a first input resistor, and an input voltage source is connected between the other end of the first input resistor and the high potential supply terminal of a DC power source. A second resistor is connected between the emitter of the second transistor and the high potential supply terminal of the DC power source. First and second constant current sources, which provide equal constant currents, are connected between the collector of the first transistor and a low potential supply terminal of the DC power source and between the collector of the second transistor and the low potential supply terminal, respectively. A third transistor of NPN-type has its collector connected to the connection point between the emitter of the second transistor and a second input resistor, and its base connected to the connection point between the collector of second transistor and the second constant current source. An output current proportional to the input voltage is drawn from the emitter of third transistor.

7 Claims, 9 Drawing Figures

INTEGRABLE CONVERSION CIRCUIT FOR CONVERTING INPUT VOLTAGE TO OUTPUT CURRENT OR VOLTAGE

BACKGROUND OF THE INVENTION

The present invention relates to a conversion circuit adapted to convert a small signal voltage to a current or voltage having a magnitude proportional to that of the small signal voltage, which signal voltage varies with reference to the high potential of a DC power supply source.

It is often needed in electronic circuits to produce a current or voltage proportional to a small signal voltage. A voltage-to-current or voltage-to-voltage conversion circuit is employed to achieve this purpose. FIG. 1 shows a prior art voltage-to-current converter circuit disclosed in an article entitled "AN INTEGRABLE PRECISION VOLTAGE-TO-CURRENT CONVERTER WITH BILATERAL CAPABILITY" by S. Pookaiyaudom et al, IEEE J. Solid-State Circuits, vol. SC-13, no. 3, pp. 411-413, June 1978. As shown, the circuit is comprised of a pair of constant current supply sources 1 and 2 for supplying constant current Iref currents as shown, NPN transistors $Q_1$-$Q_5$, and a pair of input resistors 3 and 4. An input voltage Vin is applied between the input resistor 3 and the negative power supply terminal of a DC power source. Namely, the input voltage Vin is applied to the circuit with the negative potential of a DC power source taken as reference.

If the output current is represented by I, the base-to-emitter voltages of transistors $Q_1$-$Q_4$ are represented respectively by $V_{BE1}$, $V_{BE2}$, $V_{BE3}$ and $V_{BE4}$, and the resistance values of resistors 3 and 4 are represented respectively by $R_3$ and $R_4$ in the circuit, the following equation will be obtained:

$$V_{BE1}+V_{BE4}+(Iref+I)R_4=V_{BE2}+V_{BE3}+Iref\cdot R_3+Vin \quad (1)$$

With $V_{BE1}=V_{BE3}$, $V_{BE2}=V_{BE4}$, and $R_3=R_4=R$, equation (1) will be rewritten as follows:

$$I\cdot R = Vin \quad (2)$$

It is therefore understood that output current I is given by Vin/R and proportional to input voltage Vin.

However, because output current I flows through transistor $Q_4$ and resistor 4 in addition to constant current Iref of constant current supply source 2 in the prior art circuit shown in FIG. 1, unbalance is caused between collector currents of transistors $Q_3$ and $Q_4$ when input voltage Vin becomes large. For the purpose of preventing degradation of the accuracy of output current I because of this unbalance between collector currents, the prior art circuit needs means for preventing the unbalance between collector currents, which renders the circuit arrangement complicated.

A more important problem of prior art circuit is that the input voltage Vin cannot be applied to the circuit without taking the low potential of a DC power source as a reference. Even if the polarity of the power source and the conductivity type of transistors $Q_1$-$Q_5$ employed in the prior art circuit are reversed so as to convert an input voltage, which varies with respect to the high potential of DC power source, to current or voltage, no high accuracy conversion circuit will be realized.

SUMMARY OF THE INVENTION

An object of the present invention is to provide a conversion circuit capable of converting with high accuracy an input voltage, which varies with reference to the high potential of a DC power source, to a current or voltage having a magnitude proportional to that of the input voltage.

The conversion circuit embodying the present invention includes first and second transistors of first conductivity type whose bases are connected to each other. The base and collector of the first transistor are connected to each other. One end of a first input resistor is coupled to the emitter of first transistor, while an input voltage supply source is coupled between the other end of first the input resistor and the high potential supply terminal a DC power source. Connected between the emitter of the second transistor and the high potential supply terminal of a DC power source is a second input resistor having a resistance value substantially equal to that of first input resistor. Respectively connected between the collector of the first transistor and the low potential supply terminal of the DC power source and between the collector of second transistor and the low potential supply terminal of DC power source are first and second constant current sources for supplying substantially equal constant currents. Respectively connected to the connection point between the emitter of the second transistor and the second input resistor and to the connection point between the collector of the second transistor and the second constant current source are the collector and base of a third transistor of second conductivity type. An output current proportional to the input voltage is taken from the emitter of the third transistor. An output voltage proportional to the input voltage can be provided by connecting an output resistor between the emitter of third transistor and the low potential supply terminal of the DC power source which is supplied with the output current.

Fourth to seventh transistors of first conductivity type may be added to the circuit to further enhance conversion accuracy. The third transistor may be comprised of a Darlington pair.

DETAILED DESCRIPTION OF THE PREFERRED EMBODIMENTS

Figure 1:
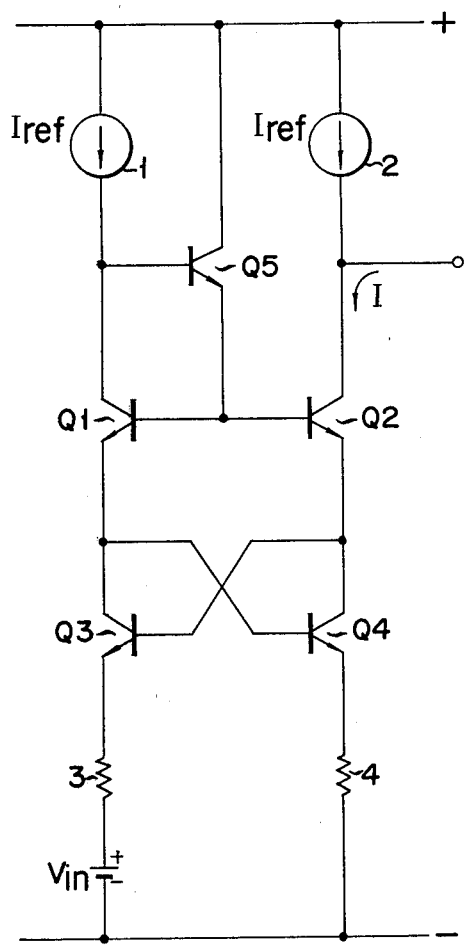
FIG. 1 is a circuit diagram showing a prior art conversion circuit.
Figure 2:
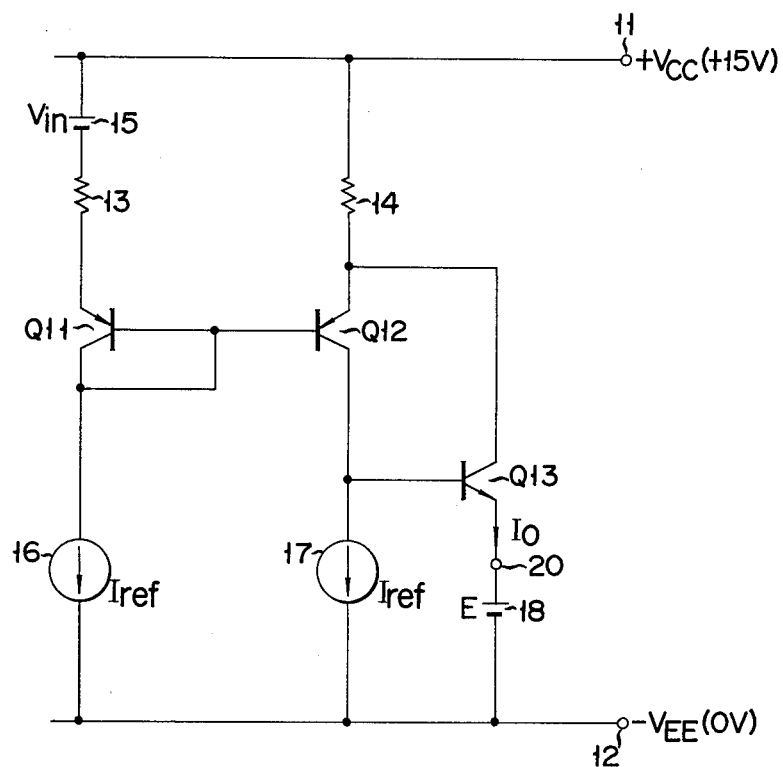
FIG. 2 is a circuit diagram of a voltage-to-current circuit according to the present invention.

Referring to FIG. 2, there is shown a voltage-to-current converter circuit according to the present invention which includes PNP transistors $Q_{11}$ and $Q_{12}$ having their bases connected together. The emitters of transistors $Q_{11}$ and $Q_{12}$ are connected to first ends of input resistors 13 and 14, respectively. The second end of input resistor 14 is connected to a high potential (e.g. 15 V) supply terminal 11 of a DC source, while a signal voltage source 15, which may be either DC or AC, is connected between the second end of resistor 13 and the power source terminal 11. The base and collector of transistor $Q_{11}$ are connected together to a low potential (e.g. 0 V) supply terminal 12 of a DC power source through a constant current source 16, which provides a constant current of Iref is shown. Connected between the collector of transistor $Q_{12}$ and the low potential supply terminal 12 is another constant current source 17, which provides the constant current Iref as shown.

The collector and base of an NPN transistor $Q_{13}$ are connected to the emitter and collector of transistor $Q_{12}$, respectively. Transistors $Q_{12}$ and $Q_{13}$ form a negative feedback loop. Connected between the emitter of transistor $Q_{13}$ and the low potential supply terminal 12 is a voltage supply source 18 (about 1 V), which serves to usually bias the emitter of transistor $Q_{13}$ to a positive potential E. The connection between the emitter of transistor $Q_{13}$ and voltage supply source 18 defines an output terminal 20.

Since, in the circuit of FIG. 2, the signal source 15 is connected between the high power supply terminal 11 and the input resistor 13 as described above, an input voltage Vin is applied to the circuit with the high potential of the DC power source taken as a reference. The output current Io is drawn from the emitter of transistor $Q_{13}$.

Provided that the common-emitter current gain of transistors $Q_{11}$–$Q_{13}$ is large enough, current flowing through the resistor 13 is equal to Iref, while current flowing through the resistor 14 is equal to the sum of Iref and Io. The following equation will be established in a closed loop comprised of transistors $Q_{11}$, $Q_{12}$, resistors 13, 14 and input signal source 15:

$$Vin - R(Iref + Io) - V_{BE}(Q_{12}) + V_{BE}(Q_{11}) + R \cdot Iref = 0 \quad (3)$$

where R represents resistance values of resistors 13 and 14, and $V_{BE}(Q_{11})$ and $V_{BE}(Q_{12})$ represents base-emitter voltages of transistors $Q_{11}$ and $Q_{12}$, respectively.

If the the base-emitter voltages of transistors $Q_{11}$ and $Q_{12}$ are equal to each other and thus $V_{BE}(Q_{11}) = V_{BE}(Q_{12})$, then equation (3) will be rewritten as follows:

$$Vin - R \cdot Io = 0 \quad (4)$$

Therefore, the output current Io is proportional to the input voltage Vin as expressed as follows:

$$Io = \frac{Vin}{R} \quad (5)$$

The effect of the negative feedback loop, which comprises transistors $Q_{12}$ and $Q_{13}$, will be now described. A rise in the emitter potential of transistor $Q_{12}$ results in an increase in the collector current thereof. As the result, the base current and collector current of transistor $Q_{13}$ increase so that the voltage drop across the resistor 14 increases and the emitter potential of transistor $Q_{12}$ is lowered accordingly. Therefore, the emitter potential of transistor $Q_{12}$ is lowered by the negative feedback loop to compensate for any rise in emitter potential of transistor $Q_{12}$. On the contrary, when the emitter potential of transistor $Q_{12}$ falls, the collector currents of transistors $Q_{12}$ and $Q_{13}$ decrease so that the voltage drop across the resistor 14 decreases, thereby raising the emitter potential of transistor $Q_{12}$. As described above, the variation in potential at the emitter of transistor $Q_{12}$ is usually compensated by the negative feedback loop, so that the output current Io taken from the emitter of transistor $Q_{13}$ is usually held constant unless input voltage Vin changes. Accordingly, voltage-to-current conversion can be attained with high accuracy. The transistor $Q_{13}$ may be combined with a PNP transistor to form an equivalent NPN transistor as well known in the art.

When the circuit of FIG. 2 is formed as an integrated circuit, the emitter currents of transistors $Q_{11}$ and $Q_{12}$ are in practicality different from each other because the common-emitter current gain of PNP transistors $Q_{11}$ and $Q_{12}$ is extremely low compared to that of NPN transistor $Q_{13}$. When emitter the currents of transistors $Q_{11}$ and $Q_{12}$ are represented by $I_{E11}$ and $I_{E12}$, respectively, equation (5) may be rewritten as follows:

$$Io = \frac{Vin}{R} + (I_{E11} - I_{E12}) + \frac{Vos}{R} \quad (6)$$

Vos in equation (6) represents a voltage generated by a difference between the emitter currents of transistors $Q_{11}$ and $Q_{12}$ and is expressed as follows:

$$Vos = V_{BE}(Q_{11}) - V_{BE}(Q_{12}) \quad (7)$$

$(I_{E11} - I_{E12})$ in equation (6) represents an error in output current Io caused by low common-emitter current gain of transistors $Q_{11}$ and $Q_{12}$. The magnitude of this error amounts to about $2/\beta$ when the common-emitter current gain is represented by $\beta$. Vos/R in equation (6) stands for an error caused by an offset voltage.

Figure 3:
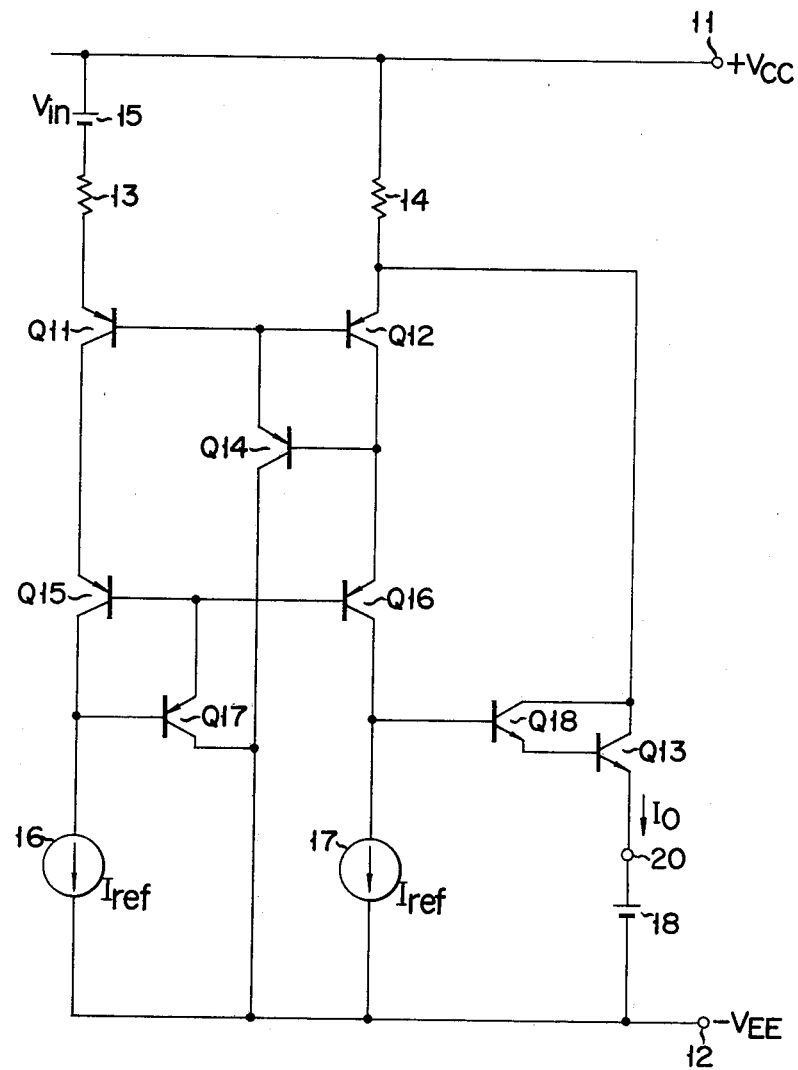
FIG. 3 is a circuit diagram of another voltage-to-current conversion circuit according to the present invention which exhibits an improved conversion accuracy relative to that of the circuit shown in FIG. 2.

FIG. 3 shows another embodiment of a conversion circuit according to the present invention in which PNP transistors $Q_{14}$–$Q_{17}$ and an NPN transistor $Q_{18}$ are added to the circuit of FIG. 2 to make the output current error small. The transistor $Q_{14}$ has its base and emitter connected to the collector and base of transistor $Q_{12}$, respectively, and its collector connected to the power supply terminal 12. The transistors $Q_{15}$ and $Q_{16}$ have their bases connected together, their emitters connected to the collectors of transistors $Q_{11}$ and $Q_{12}$, respectively, and their collectors connected to the constant current supply sources 16 and 17, respectively. The transistor $Q_{17}$ has its base connected to the collector of transistor $Q_{15}$, its emitter connected to the bases of transistors $Q_{15}$ and $Q_{16}$, and its collector connected to the power supply terminal 12. The transistor $Q_{18}$ which forms a Darlington-pair together with the transistor $Q_{13}$ has its collector and emitter connected to the collector and base of transistor $Q_{13}$, respectively, and its base connected to the collector of transistor $Q_{16}$. For the purpose of discussion, assume that in the circuit of FIG. 3, the transistors $Q_{11}$, $Q_{12}$ and $Q_{14}$ $Q_{17}$ are well matched in their characteristics if the common-emitter current gain and the common-base current gain of each transistor are denoted respectively by $\beta$ and $\alpha$, where $= \beta/(\beta+1)$. Further, assume that the emitter currents of transistors $Q_{11}$ and $Q_{12}$ are equal to each other. Then, the collector current of transistor $Q_{11}$ is $\alpha I_E$ and the base current thereof $\alpha/\beta I_E$. Similarly, the collector current of transistor $Q_{12}$ is $\alpha I_E$ and the base current thereof $\alpha/\beta I_E$. The emitter current of transistor $Q_{14}$ is $2\alpha/\beta I_E$, equal to the sum of base currents of transistors $Q_{11}$ and $Q_{12}$, and base current thereof is $$\frac{2\alpha^2}{\beta^2} I_E.$$

The emitter current of transistor $Q_{16}$ is $$\alpha \left(1 + \frac{2\alpha}{\beta^2}\right) I_E$$

equal to the sum of collector current of transistor $Q_{12}$ and the base current of transistor $Q_{14}$. Therefore, the base current of transistor $Q_{16}$ is $$\frac{\alpha^2}{\beta} \left(1 + \frac{2\alpha}{\beta^2}\right) I_E$$

and the collector current thereof $$\alpha^2 \left(1 + \frac{2\alpha}{\beta^2}\right) I_E.$$

On the other hand, the base current of transistor $Q_{15}$ whose emitter current is $\alpha I_E$ is $\alpha^2/\beta I_E$ and the collector current thereof $\alpha^2 I_E$. The emitter current of transistor $Q_{17}$ is $$\frac{2\alpha^2}{\beta} \left(1 + \frac{\alpha}{\beta^2}\right) I_E$$

equal to the sum of base currents of transistors $Q_{15}$ and $Q_{16}$ and thus, the base current of transistor 917 is $$\frac{2\alpha^3}{\beta^2} \left(1 + \frac{\alpha}{\beta^2}\right) I_E.$$

Figure 4:
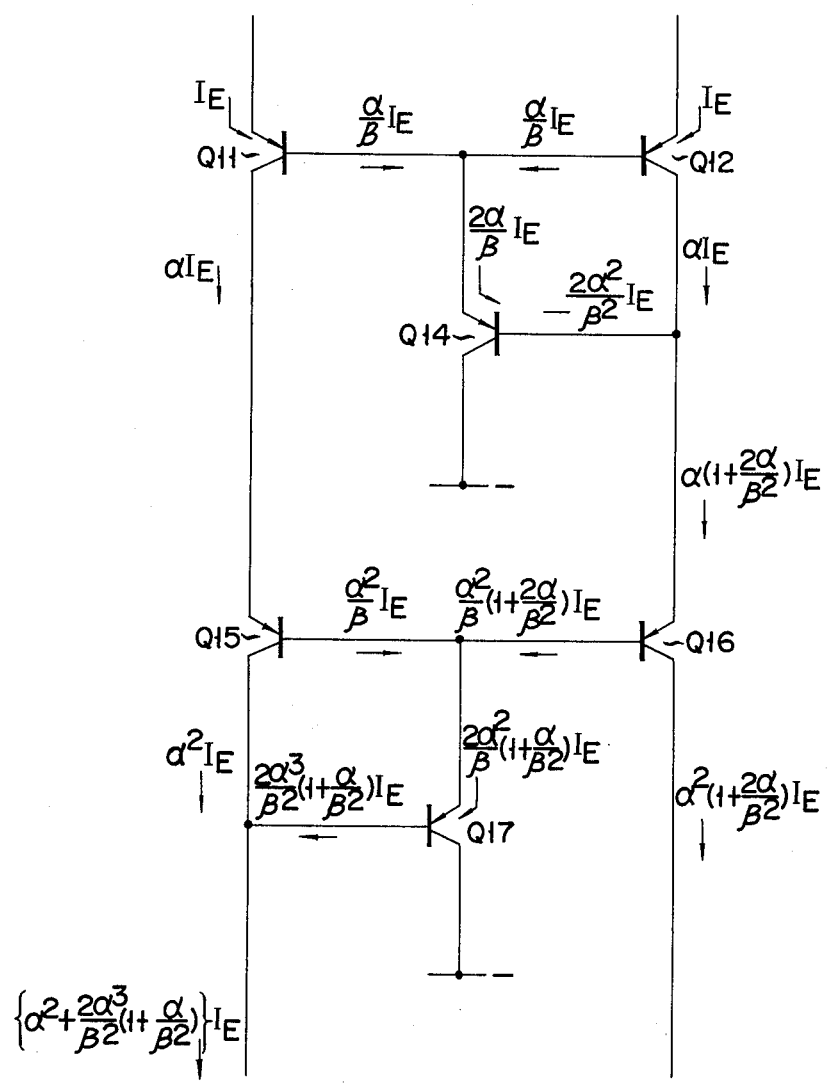
FIG. 4 is a diagram used to explain magnitudes of currents flowing through various portions of the conversion circuit of FIG. 3.

Accordingly, current $$\left\{ \alpha^2 + \frac{2\alpha^3}{\beta^2} \left(1 + \frac{\alpha}{\beta^2}\right) \right\} I_E$$

flows out of the connection point between the collector of transistor $Q_{15}$ and the base of transistor $Q_{17}$. The values of currents mentioned above are shown in FIG. 4.

If current flowing out of the connection point between the collector of transistor $Q_{15}$ and the base of transistor $Q_{17}$ is $I_A$ and the current flowing out of the collector of transistor $Q_{16}$ is $I_B$, the ratio between $I_A$ and $I_B$ will be given by:

$$\frac{I_B}{I_A} = \frac{\alpha^2 \left(1 + \frac{2\alpha}{\beta^2}\right) I_E}{\left\{ \alpha^2 + \frac{2\alpha^3}{\beta^2} \left(1 + \frac{\alpha}{\beta^2}\right) \right\} I_E} \quad (8)$$

Substituting $$\alpha = \frac{\beta}{\beta + 1}$$

into equation (8) yields $$\frac{I_B}{I_A} = \frac{1}{1 + \frac{2}{\frac{\beta^2(\beta + 1)^2}{1 + \frac{2}{\beta(\beta + 1)}}}} \quad (9)$$

when $\beta$ is larger enough than 1, $2/\beta(\beta+1)$ becomes smaller than 1, and therefore, equation (9) can be approximated as follows:

$$\frac{I_B}{I_A} \simeq 1 - \frac{2}{\beta^4} \quad (10)$$

Currents $I_A$ and $I_B$ are output currents of the constant current sources 16 and 17 and must be therefore equal to each other. Accordingly, an error of $2/\beta^4$ is caused between the emitter currents of transistors $Q_{11}$ and $Q_{12}$ which are previously assumed equal to each other. This error is smaller enough than the error $2/\beta$ in the circuit shown in FIG. 2. In addition, the offset voltage caused by the error between the emitter currents of transistors $Q_{11}$ and $Q_{12}$ can be suppressed smaller than 0.1 mV.

On the other hand, the accuracy of output current Io can be made extremely high due to the Darlington connection of the transistors $Q_{13}$ and $Q_{18}$. The error in Darlington-connected transistors is $1/\beta^2$.

Figure 5:
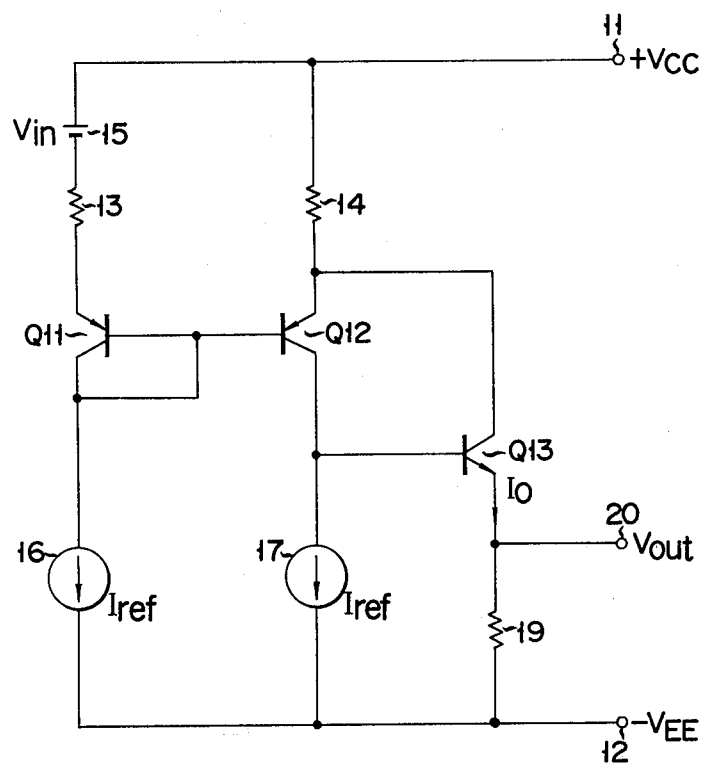
FIG. 5 is a circuit diagram of a voltage-to-voltage conversion circuit according to the present invention.

FIG. 5 shows a voltage-to-voltage converter circuit according to the present invention in which the voltage supply source 18 employed in the circuit of FIG. 2 is replaced by a resistor 19. The circuit of FIG. 5 is arranged in such a way that an output voltage Vout proportional to input voltage Vin can be taken from an output terminal 20.

As described above, since the output current Io drawn from the emitter of transistor $Q_{13}$ is proportional to the input voltage Vin, a voltage drop across the resistor 19, that is, the output voltage Vout is also proportional to the input voltage Vin. If the resistance value of input resistors 13 and 14 is denoted by $R_1$ and that of output resistor 19 by $R_2$, Vout is given by $$\text{Vout} = \frac{R_2}{R_1} \cdot \text{Vin} \quad (11)$$

Therefore, the conversion ratio or amplification of the conversion circuit can be changed by varying the ratio between $R_1$ and $R_2$. In the circuit shown in FIG. 5 the input voltage Vin is supplied to the circuit with the high potential of a DC power source taken as a reference, while the output voltage Vout is taken from the circuit with the low potential taken as a reference. Accordingly, the output voltage Vout can be easily be processed by a utilization circuit.

Figure 6:
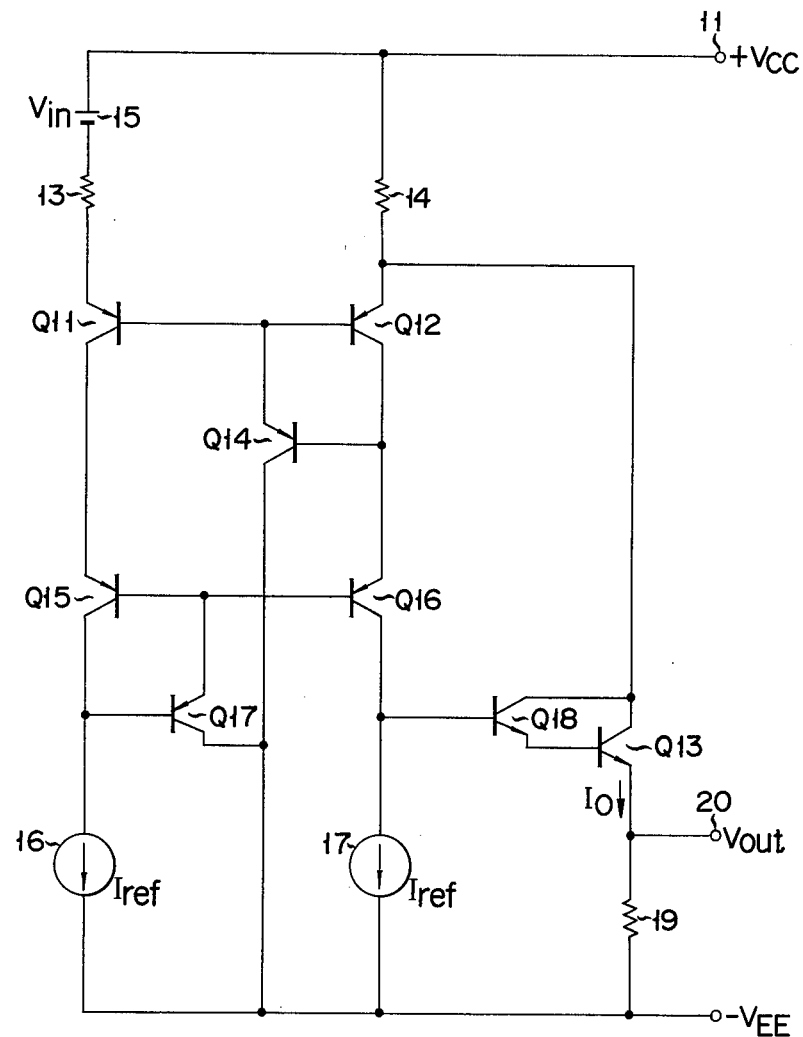
FIG. 6 is a circuit diagram of another voltage-to-voltage conversion circuit according to the present invention which exhibits an improved conversion accuracy relative to that of the circuit shown in FIG. 5.

FIG. 6 shows a voltage-to-voltage converter circuit of high accuracy which is modified from the circuit of FIG. 5 according to the teaching of circuit shown in FIG. 3. That is, the voltage supply source 18 of FIG. 3 is replaced by a resistor 19, and an output terminal 20 between resistor 19 and the emitter of transistor $Q_{13}$ provides an output voltage $V_{out}$ proportional to input voltage $V_{in}$.

Figure 7:
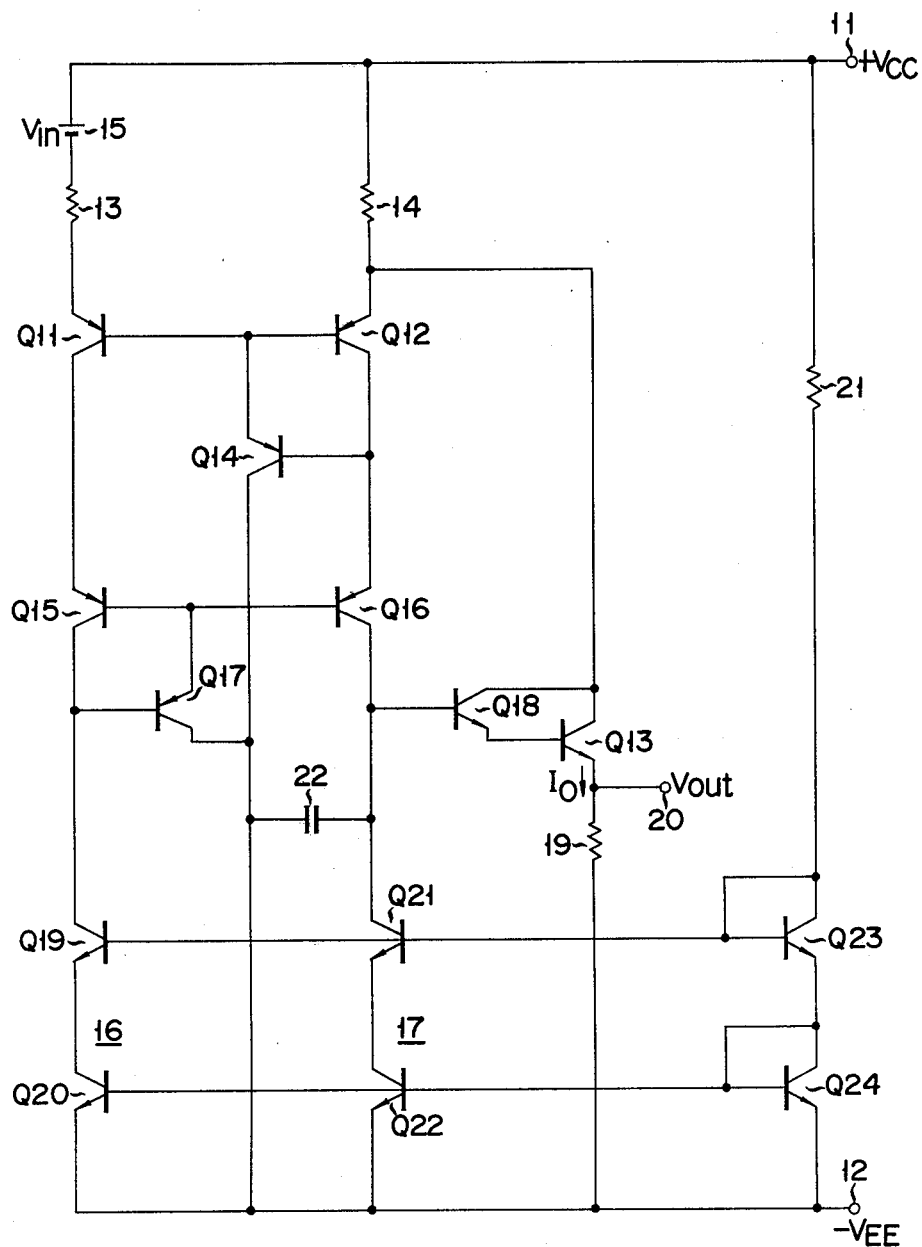
FIG. 7 is a circuit diagram of the voltage-to-voltage conversion circuit of FIG. 6 in integrable form.

FIG. 7 shows the voltage-to-voltage converter circuit of FIG. 6 in integrable form. A resistor 21 and NPN transistors $Q_{19}$–$Q_{24}$ of FIG. 7 form constant current sources. The resistance value of input resistors 13 and 14 is 1 k$\Omega$, that of output resistor 19 is 10 k$\Omega$, that of resistor 21 is 100 k. The value of capacitor 22 is 5 pF, and Iref is 100 $\mu$A. Therefore, the amplification A of this converter circuit is 10.

The following table shows measured values of output voltage Vout relative to each value of input voltage Vin in the circuit of FIG. 7. Calculated values of amplification A and an error rate $\epsilon$ corresponding to each measured value are listed below in Table I.

TABLE I

| Vin(mV) | Vout(mV) | A | $\epsilon$(%) |
|---|---|---|---|
| 2.94 | 34.22 | 11.64 | 16.4 |
| 10.60 | 110.67 | 10.36 | 3.6 |
| 20.12 | 205.50 | 10.21 | 2.1 |
| 30.40 | 308.11 | 10.14 | 1.4 |
| 40.57 | 409.90 | 10.10 | 1.0 |
| 50.69 | 511.00 | 10.08 | 0.8 |
| 60.05 | 604.50 | 10.07 | 0.7 |
| 70.55 | 709.40 | 10.06 | 0.6 |
| 80.04 | 804.10 | 10.05 | 0.5 |
| 90.06 | 904.60 | 10.04 | 0.4 |
| 100.99 | 1014.00 | 10.04 | 0.4 |
| 110.37 | 1107.60 | 10.04 | 0.4 |
| 120.02 | 1204.10 | 10.03 | 0.3 |
| 130.22 | 1306.00 | 10.03 | 0.3 |
| 140.86 | 1412.40 | 10.03 | 0.3 |
| 150.85 | 1511.90 | 10.02 | 0.2 |

Figure 9:
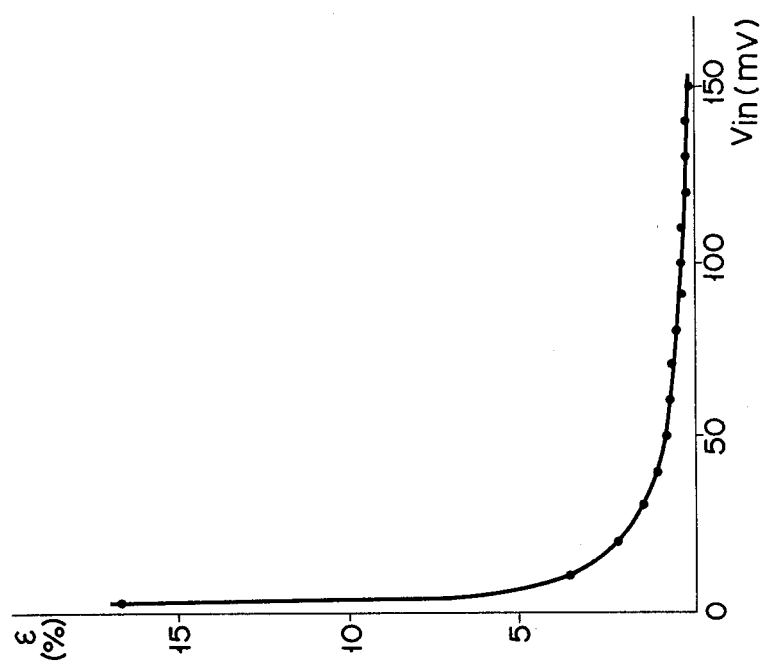
FIGS. 8 and 9 show conversion characteristics of conversion circuit shown in FIG. 7.
Figure 8:
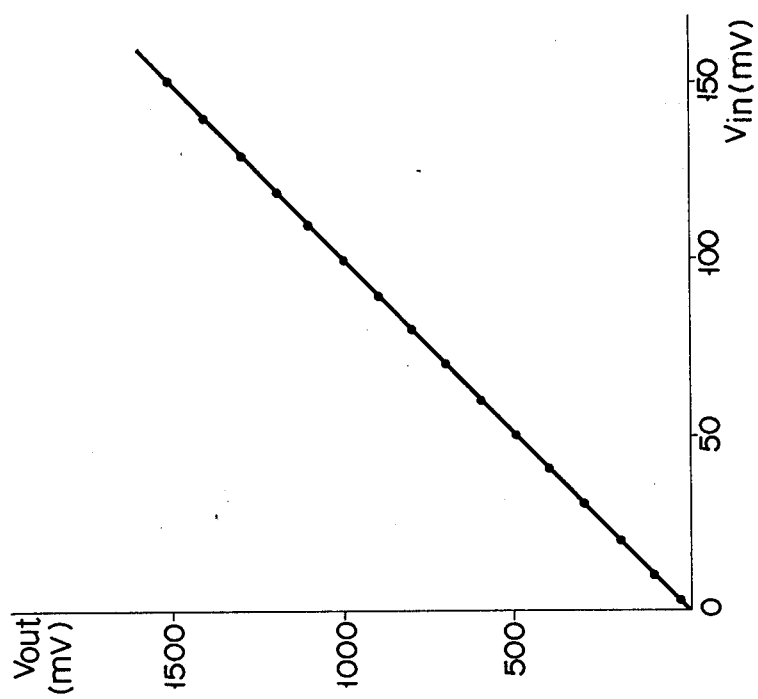

FIG. 8 shows the characteristic of output voltage Vout relative to input voltage Vin resulted from the figures in Table I. The straight line represents theoretical values, and the black dots locate measured values. FIG. 9 shows the characteristics of error rate $\epsilon$ relative to input voltage Vin. As apparent from FIGS. 8 and 9, it can be understood that the accuracy and linearity of amplification A are excellent. When input voltage Vin is 0, error rate $\epsilon$ approaches to infinity because the offset voltage is constant irrespective of input voltage Vin. Therefore, $\epsilon$ is reduced as Vin becomes large, becoming smaller than 1% when Vin is over 40 mV and smaller than 0.3% when Vin becomes larger.

What we claim is:

1. A conversion circuit comprising:
a. first and second power supply terminals adapted for connection respectively to high and low potentials of a DC power source;
b. first and second transistors each having a base, emitter, and collector, the bases of said first and second transistors being commonly connected to each other;
c. first resistance means having first and second ends with the first end thereof connected to the emitter of said first transistor;
d. second resistance means connected between the emitter of said second transistor and said first power supply terminal and having a resistance value substantially equal to that of said first resistance means;
e. input voltage supply means connected to said second end of said first resistance means and said first power supply terminal for supplying an input voltage;
f. first and second current supply means respectively connected between the collector of said first transistor and said second power supply terminal and between the collector of said second transistor and said second power supply terminal for supplying said first and second transistors with currents; and
g. output control means having the main current path thereof connected between the emitter of said second transistor and an output terminal and being controlled by the signal from the connecting point between said second transistor and said second current supply means.

2. A conversion circuit according to claim 1, wherein said output control means is comprised of a transistor.

3. A conversion circuit according to claim 1 further comprising third and fourth transistors having the collector current paths thereof connected between said first transistor and said first current supply means and between said second transistor and said second current supply means, respectively, and having the bases thereof commonly connected.

4. A conversion circuit according to claim 3 further comprising:
a. a fifth transistor having the collector current path thereof connected between the commonly connected bases of said first and second transistors and said second power supply terminal and the base thereof connected to the connection point of said second and fourth transistors; and
b. a sixth transistor having the collector current path thereof connected between the commonly connected bases of said third and fourth transistors and said second power supply terminal and the base thereof connected to the connection point of said third transistor and said first current supply means.

5. A conversion circuit according to claim 1 further comprising a DC voltage source connected between an electrode of said output control means and said second power supply terminal for biasing the electrode of said output control means.

6. A conversion circuit according to claim 1 further comprising a load connected between an electrode of said output control means and said second power supply teriminal.

7. A conversion circuit according to claim 1, 5 or 6 wherein said output control means is comprised of a Darlington-connected transistor pair.

* * * * *